(12) United States Patent
Goshima et al.

(10) Patent No.: US 9,734,277 B2
(45) Date of Patent: Aug. 15, 2017

(54) SEMICONDUCTOR DEVICE DESIGNING METHOD, DESIGNING APPARATUS, AND COMPUTER-READABLE STORAGE MEDIUM

(71) Applicant: SOCIONEXT INC., Yokohama-shi, Kanagawa (JP)

(72) Inventors: Kenta Goshima, Kasugai (JP); Fumitaka Shiraishi, San Jose, CA (US); Yoshihiko Masushio, Kasugai (JP); Yasuhiro Yokoi, Kasugai (JP); Hideyuki Shimizu, Tajimi (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/921,791

(22) Filed: Oct. 23, 2015

(65) Prior Publication Data
US 2016/0132629 A1    May 12, 2016

(30) Foreign Application Priority Data
Nov. 10, 2014  (JP) .................................. 2014-227884

(51) Int. Cl.
*G06F 17/50* (2006.01)
(52) U.S. Cl.
CPC ................. *G06F 17/5077* (2013.01)
(58) Field of Classification Search
CPC .................................................. G06F 17/5077
USPC ....................................................... 716/126
See application file for complete search history.

(56) References Cited

U.S. PATENT DOCUMENTS

| | | | |
|---|---|---|---|
| 2008/0127020 A1* | 5/2008 | Rittman | G06F 17/5068 716/51 |
| 2009/0140435 A1* | 6/2009 | Lynch | H01L 23/544 257/774 |
| 2009/0193382 A1* | 7/2009 | Melzner | G06F 17/5072 716/129 |
| 2011/0254170 A1 | 10/2011 | Ishii | |
| 2012/0198409 A1* | 8/2012 | Zhang | G06F 17/505 716/132 |
| 2016/0063163 A1* | 3/2016 | Moroz | H01L 29/0676 716/110 |

FOREIGN PATENT DOCUMENTS

| | | |
|---|---|---|
| JP | 2005-116902 A | 4/2005 |
| JP | 2011-505076 A | 2/2011 |
| JP | 2011-228349 A | 11/2011 |

* cited by examiner

*Primary Examiner* — Suresh Memula
(74) *Attorney, Agent, or Firm* — Arent Fox LLP

(57) ABSTRACT

A method designs a semiconductor device that includes first and second wirings provided in an uppermost of wiring layers, and a setting part coupled to the first and second wirings and including third and fourth wirings provided in each of the wiring layers, and vias that electrically connect wirings of different wiring layers, wherein each of the third and fourth wirings in each of the wiring layers extends in one of 2 mutually perpendicular directions, and the third and fourth wirings in the wiring layers are arranged and connected so as to turn around using the vias as turn-around points. The method modifies a direction in which the third and fourth wirings extend in one wiring layer specified by layer information, and modifying a connection of the first and second wirings with respect to the third and fourth wirings in a lowermost of the wiring layers.

18 Claims, 12 Drawing Sheets

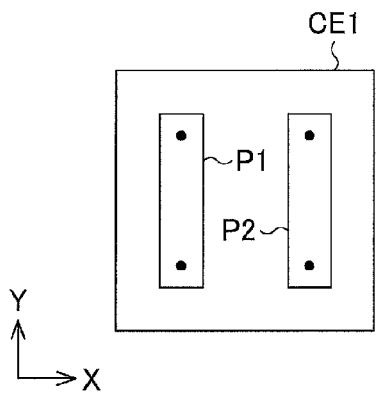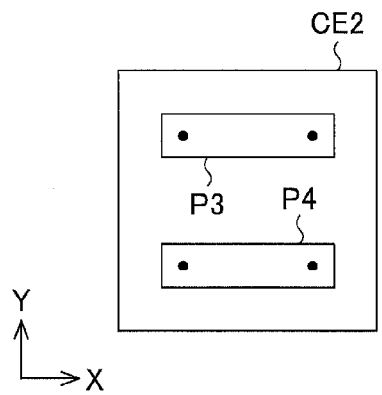

US 9,734,277 B2

SEMICONDUCTOR DEVICE DESIGNING METHOD, DESIGNING APPARATUS, AND COMPUTER-READABLE STORAGE MEDIUM

CROSS-REFERENCE TO RELATED APPLICATIONS

This application is based upon and claims the benefit of priority of the prior Japanese Patent Application No. 2014-227884, filed on Nov. 10, 2014, the entire contents of which are incorporated herein by reference.

FIELD

The embodiments discussed herein are related to a semiconductor designing method, a designing apparatus, and a computer-readable storage medium.

BACKGROUND

Conventionally, various fixed values are set in a semiconductor device. For example, revision information (or version code) of the semiconductor device is an example of the fixed value. The semiconductor device is redesigned by modifying circuits, which may include correcting logics, improving characteristics, or the like. When redesigning the semiconductor device, a mask that is used in a semiconductor device manufacturing process is revised. In addition, the revision information, such as the version code, in accordance with a modification log, is stored in the semiconductor device, as proposed in Japanese Laid-Open Patent Publication No. 2005-116902 and Japanese National Publication of International Patent Application No. 2011-505076, for example.

The fixed values described above are set by connecting input terminals of a logic circuit and a register to wirings (or power supply lines) applied with a high voltage and a low voltage, for example. In addition, the fixed values are modified by the connection of the wirings or vias. Accordingly, in a case in which a layer for modifying the wiring or via for the purposes of correcting the logic, improving the characteristic, or the like is different from a layer for modifying the fixed value such as the revision information, it is necessary to create masks for these layers. An increase in the number of masks created causes an increase in the cost that is required to manufacture the semiconductor device.

SUMMARY

Accordingly, it is an object in one aspect of the embodiments to provide a semiconductor device designing method, a designing apparatus, and a computer-readable storage medium, which can reduce the cost associated with the revision.

According to one aspect of the embodiments, a method designs a semiconductor device which includes first and second wirings provided in an uppermost wiring layer amongst a plurality of wiring layers, and a setting part, coupled to the first and second wirings, and including third and fourth wirings provided in each of the plurality of wiring layers, and a plurality of vias that electrically connect wirings of different wiring layers amongst the plurality of wiring layers, wherein each of the third and fourth wirings in each of the plurality of wiring layers extends in one of a first direction and a second direction that is perpendicular to the first direction, and the third and fourth wirings in the plurality of wiring layers are arranged and connected so as to turn around using the plurality of vias as turn-around points, and wherein the method includes modifying, by a computer, a direction in which the third and fourth wirings extend in one wiring layer that is specified by layer information stored in a storage of the computer; and modifying, by the computer, a connection of the first and second wirings with respect to the third and fourth wirings in a lowermost wiring layer amongst the plurality of wiring layers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 13A and 13B are diagrams for explaining wiring pattern cells;

FIGS. 14A and 14B are diagrams for explaining a management table; and

FIGS. 15A, 15B, and 15C are diagrams for explaining the management table.

DESCRIPTION OF EMBODIMENTS

Figure 1:
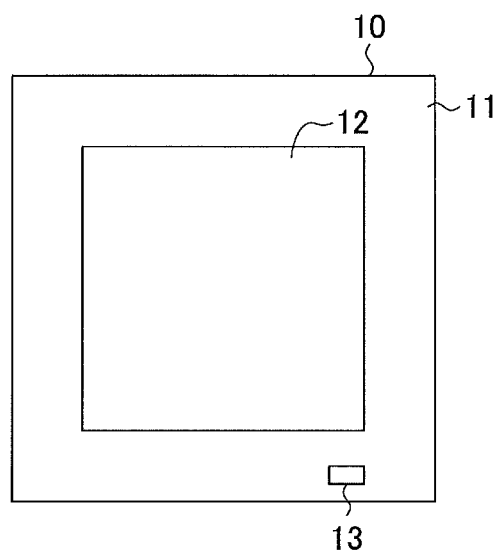
FIG. 1 is a diagram schematically illustrating a semiconductor device.

Preferred embodiments of the present invention will be described with reference to the accompanying drawings.

In the drawings, constituent elements may be illustrated on an enlarged scale to facilitate understanding. In addition, dimensional ratios of the constituent elements are not illustrated according to actual scale, and the scales that are used may differ amongst the drawings. Furthermore, in order to facilitate the understanding, some constituent elements may be illustrated in half-tone.

A description will now be given of a semiconductor device designing method, a designing apparatus, and a computer-readable storage medium in each embodiment according to the present invention.

As illustrated in FIG. 1, a semiconductor device 10 has a rectangular shape in a plan view, and a plurality of cells are formed in a core region 12 on a substrate 11. The plurality of cells in the core region 12 include cells of logic circuits such as an AND circuit or the like, and macro cells of a computing unit (for example, a CPU (Central Processing Unit), a memory, an interface circuit, or the like. The core region 12 is an example of a region (or element region) in which elements included in a functional circuit of the semiconductor device 10 are formed.

A code managing circuit 13 is formed in a peripheral region of the semiconductor device 10. The code managing circuit 13 stores version information of the semiconductor device 10. The version information may be a revision code having a plurality of bits (for example, 4 bits). The revision code stored in the code managing circuit 13 is read by the CPU, for example, and is output outside the semiconductor device 10.

The code managing circuit 13 store the revision core in accordance with a state (or connection relationship) of wirings arranged in wiring layers of the semiconductor device 10. When distinguishing a state with respect to the revision code, a code added with a version number may be used. For example, the code added with the version number of the first version (or version 1) may be "13-1".

Figure 2A:
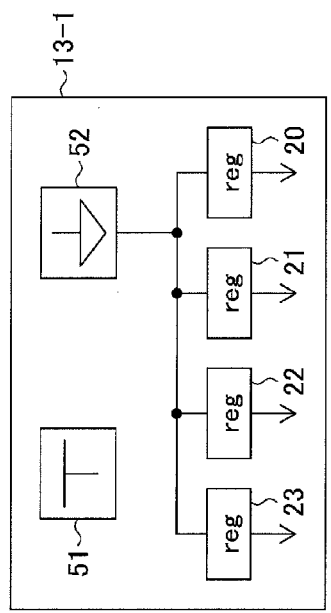
FIG. 2A is a block circuit diagram illustrating a code managing circuit.

As illustrated in FIG. 2A, a code managing circuit 13-1 includes a plurality of registers (4 registers in this example) 20, 21, 22, and 23. The register 20 is connected to one of a first voltage output circuit 51 and a second voltage output circuit 52, and stores 1-bit information in accordance with a voltage level supplied from the voltage output circuit to which the register 20 is connected. Similarly, each of the registers 21, 22, and 23 is connected to one of the first voltage output circuit 51 and the second voltage output circuit 52, and stores 1-bit information in accordance with the voltage level supplied from the voltage output circuit to which each of the registers 21, 22, and 23 is connected.

FIG. 2A illustrates the connection relationship of the code managing circuit 13-1 for the first version. Each of the registers 20 through 23 is connected to the second voltage output circuit 52. The first voltage output circuit 51 outputs a high voltage VDD. The second voltage output circuit 52 outputs a low voltage VSS. Each of the registers 20 through 23 stores a code value based on the low voltage VSS output from the second voltage output circuit 52. For example, each of the registers 20 through 23 stores a 1-bit code value "0" based on the low voltage VSS output from the second voltage output circuit 52. Accordingly, the code managing circuit 13-1 stores a revision code having a 4-bit code value "0000".

As will be described later, the register supplied with the high voltage VDD output from the first voltage output circuit 51 stores a code value "1". In other words, the high voltage VDD is an example of a voltage in accordance with the code value "1", and the low voltage VSS is an example of a voltage in accordance with the code value "0".

Figure 2B:
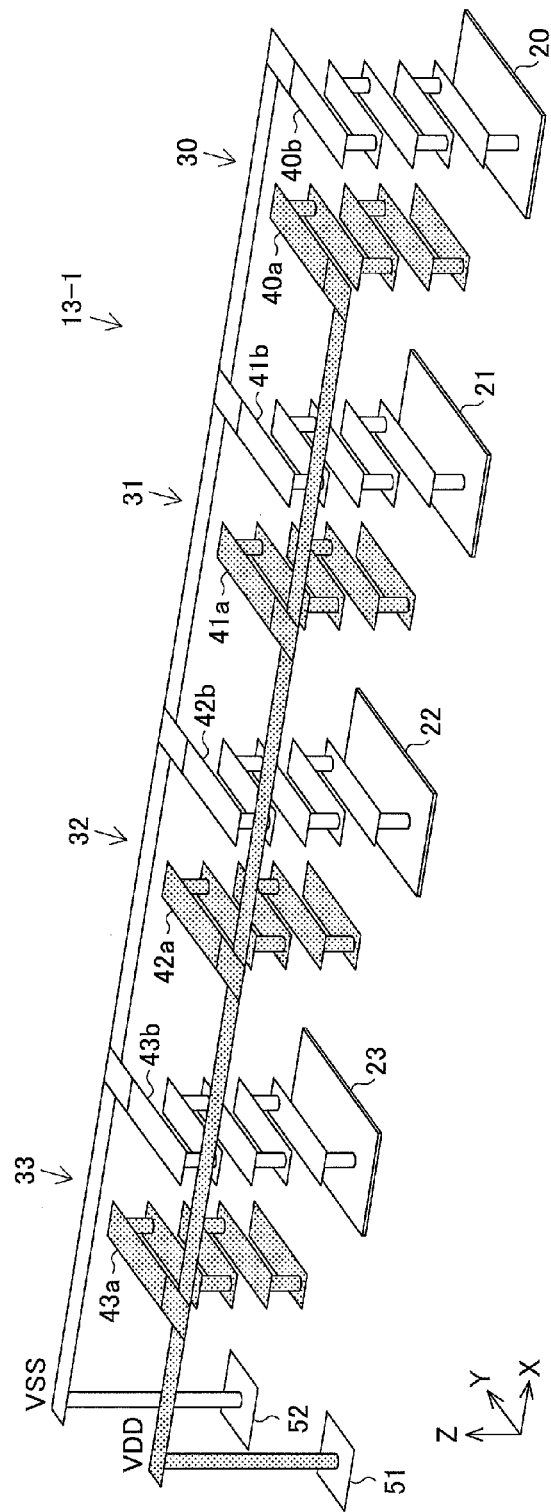
FIG. 2B is a perspective view illustrating a wiring structure of the code managing circuit.

FIG. 2B illustrates a wiring structure of the code managing circuit 13-1 in the state illustrated in FIG. 2A. The code managing circuit 13-1 includes 4 code setting units 30, 31, 32, and 33 corresponding to each of the bits of the revision code. The code setting units 30 through 33 are an example of a setting part. In FIG. 2B, members applied with the high voltage VDD are indicated in halftone, in order to facilitate understanding of the voltage level state in each of the code setting units 30 through 33.

The code setting unit 30 includes a pair of first wring part 40a and second wiring part 40b. In the code setting unit 30, the first wiring part 40a is connected to a wiring (hereinafter also referred to as a "power line VDD") supplied with the high voltage VDD that is output from the first voltage output circuit 51. In addition, the second wiring part 40b is connected to a wiring (hereinafter also referred to as a "power line VSS") supplied with the low voltage VSS that is output from the second voltage output circuit 52. In this code setting unit 30, the second wiring part 40b is connected to the register 20, but the first wiring part 40a is not connected to a register. Accordingly, the low voltage VSS is supplied to the register 20 through the second wiring part 40b. The power line VDD is an example of a first main wiring or a first power line. The power line VSS is an example of a second main wiring or a second power line.

Similarly, the code setting units 31, 32, and 33 respectively have first wiring parts 41a, 42, and 43a connected to the power line VDD, and respectively have second wiring parts 41b, 42b, and 43b connected to the power line VSS. The registers 21, 22, and 23 of the code setting units 31, 32, and 33 are connected to the second wiring parts 41b, 42b, and 43b, respectively.

In the code setting unit 30, shapes of the first wiring part 40a and the second wiring part 40b are determined based on patterns of masks that are used when manufacturing the semiconductor device 10 illustrated in FIG. 1. One of the first wiring part 40a and the second wiring part 40b is connected to the register 20, according to the shapes of the first wiring part 40a and the second wiring part 40b. The register 20 stores a code value in accordance with the connection of the code setting unit 30. For example, the register 20 stores the code value "1" by connecting the first wiring part 40a that is connected to the power line VDD to the register 20.

Similarly, the shapes of the first wiring parts 41a, 42a, and 43a and the second wiring parts 41b, 42b, and 43b are determined based on patterns of masks that are used when manufacturing the semiconductor device 10. Each of the registers 21, 22, and 23 stores a code value in accordance with the voltage supplied through the wiring part to which each of the registers 21, 22, and 23 is connected.

Figure 3:
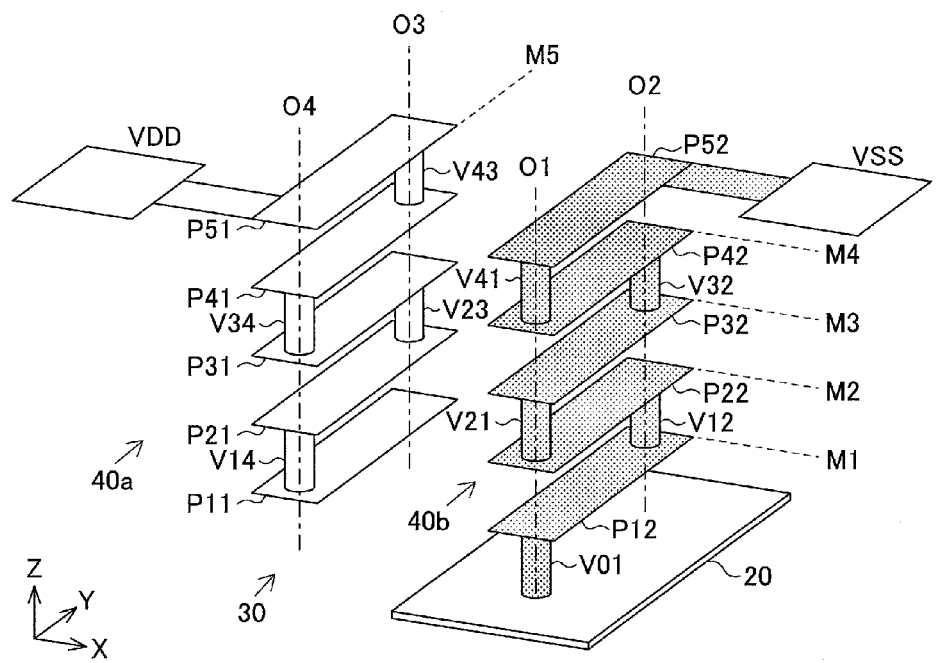
FIG. 3 is a perspective view illustrating a wiring structure of a code setting unit.

Next, a description will be given of the code setting unit 30, by referring to FIG. 3. In FIG. 3, members applied with the low voltage VSS are indicated in halftone, in order to facilitate understanding of the voltage level state at each of the members included in the code setting unit 30. The code setting units 31 through 33 illustrated in FIG. 2B are the same as the code setting unit 30, and a description and illustration thereof will be omitted.

The code setting unit 30 includes a wirings arranged in a plurality of wiring layers, and vias mutually connecting the wires. For example, the semiconductor device 10 illustrated in FIG. 1 has a multilayer interconnection structure including a plurality of wiring layer (for example, 5 wiring layers). The register 20 is formed on a substrate of the semiconductor device 10. First through fifth wiring layers M1 through M5 are arranged in this order on the substrate having the register 20 formed thereon. The first wiring layer M1 forms a lowermost wiring layer, and the fifth wiring layer M5 forms an uppermost wiring layer.

The code setting unit 30 includes a pair of wirings formed on each of the first through fifth wiring layers M1 through M5.

A pair of wirings P11 and P12 is formed on the first wiring layer M1. The wirings P11 and P12 are formed to extend in a first direction, that is, in a Y-axis direction in FIG. 3.

Figure 5:
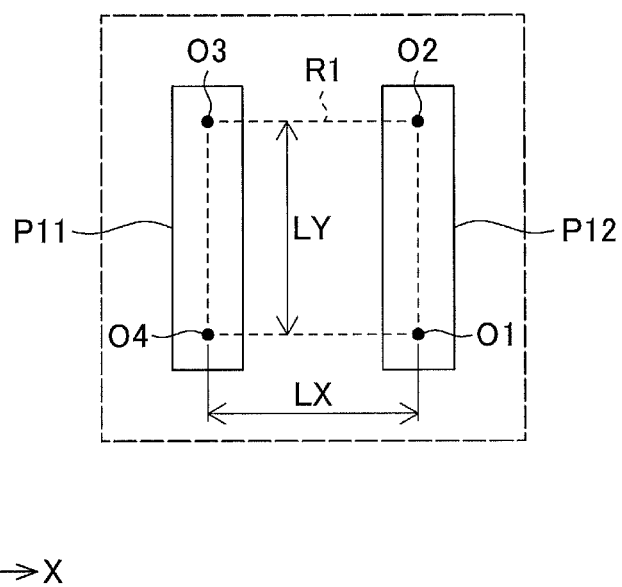
FIG. 5 is a plan view schematically illustrating the code setting unit.

As illustrated in FIG. 5, the wirings P11 and P12 have a rectangular shape in the plan view, and respectively extend in the first direction, that is, in a vertical direction in FIG. 5. Accordingly, the wirings P11 and P12 are parallel wirings that are mutually separated by a predetermined wiring spacing (or interval).

As illustrated in FIG. 3, a pair of wirings P21 and P22 is formed on the second wiring layer M2. A pair of wirings P31 and P32 is formed on the third wiring layer M3. A pair of wirings P41 and P42 is formed on the fourth wiring layer M4. A pair of wirings P51 and P52 is formed on the fifth wiring layer M5.

The wiring P21 of the second wiring layer M2 is formed above the wiring P11 of the first wiring layer M1, so as to overlap the wiring P11 in the plan view. Similarly, the wirings P31, P41, and P51 of the third, fourth, and fifth wiring layers M3, M4, and M5 are formed above the wiring P11 of the first wiring layer M1, so as to overlap the wiring P11 in the plan view.

End parts of the wirings P11, P21, P31, P41, and P51 on a front side in FIG. 3 may also be referred to as first end parts, and end parts of the wirings P11, P21, P31, P41, and P51 on a rear side in FIG. 3 may also be referred to as second end parts.

The first end part of the wiring P11 is electrically connected to the first end part of the wiring P21 of the upper layer (second wiring layer M2) through a via V14. The second end part of the wiring P21 is electrically connected to the second end part of the wiring P31 of the upper layer (third wiring layer M3) through a via V23. The first end part of the wiring P31 is electrically connected to the first end part of the wiring P41 of the upper layer (fourth wiring layer M4) through a via V34. The second end part of the wiring P41 is electrically connected to the second end part of the wiring P51 of the upper layer (fifth wiring layer M5) through a via V43.

In other words, one end part of each of the wirings P21, P31, and P41 formed on the wiring layers M2, M3, and M4 between the lowermost wiring layer M1 and the uppermost wiring layer M5 is connected to the wiring of the lower layer through the corresponding via. On the other hand, the other end part of each of the wirings P21, P31, and P41 formed on the wiring layers M2, M3, and M4 between the lowermost wiring layer M1 and the uppermost wiring layer M5 is connected to the wiring of the upper layer through the corresponding via. That is, the vias V14, V23, V34, and V43 are alternately arranged between the wiring layers M1 through M5 with respect to the end parts of the wirings P11, P21, P31, P41, and P51. Hence, the wirings P11, P21, P31, P41, and P51 of the wiring layers M1, M2, M3, M4, and M5 are connected in series by the vias V14, V23, V34, and V43. In addition, the wirings P11, P21, P31, P41, and P51 and the vias V14, V23, V34, and V43 form a zigzag-shaped wiring part in which the wirings P11, P21, P31, P41, and P51 are arranged and connected so as to turn around using the vias V14, V23, V34, and V43 as turn-around points.

In FIG. 3, the wiring P51 of the uppermost wiring layer M5 is connected to the power line VDD. Accordingly, the wirings P11, P21, P31, P41, and P51 and the vias V14, V23, V34, and V43 function as the first wiring part 40a.

The wirings P12, P22, P32, P42, and P52 are connected in a manner similar to the wirings P11, P21, P31, P41, and P51. The end parts of the wirings P12, P22, P32, P42, and P52 connected to the wirings of other wiring layers are opposite to the end parts of the wirings P11, P21, P31, P41, and P51 connected to the wirings of other wiring layers.

In FIG. 3, end parts of the wirings P12, P22, P32, P42, and P52 on the front side in FIG. 3 may also be referred to as the first end parts, and end parts of the wirings P12, P22, P32, P42, and P52 on the rear side in FIG. 3 may also be referred to as the second end parts. similarly as in the case of the wirings P11, P21, P31, P41, and P51.

The second end part of the wiring P12 is electrically connected to the second end part of the wiring P22 of the upper layer (second wiring layer M2) through a via V12. The first end part of the wiring P22 is electrically connected to the first end part of the wiring P32 of the upper layer (third wiring layer M3) through a via V21. The second end part of the wiring P32 is electrically connected to the second end part of the wiring P42 of the upper layer (fourth wiring layer M4) through a via V32. The first end part of the wiring P42 is electrically connected to the first end part of the wiring P52 of the upper layer (fifth wiring layer M5) through a via V41.

In other words, one end part of each of the wirings P22, P32, and P42 formed on the wiring layers M2, M3, and M4 between the lowermost wiring layer M1 and the uppermost wiring layer M5 is connected to the wiring of the lower layer through the corresponding via. On the other hand, the other end part of each of the wirings P22, P32, and P42 formed on the wiring layers M2, M3, and M4 between the lowermost wiring layer M1 and the uppermost wiring layer M5 is connected to the wiring of the upper layer through the corresponding via. That is, the vias V12, V21, V32, and V41 are alternately arranged between the wiring layers M1 through M5 with respect to the end parts of the wirings P12, P22, P32, P42, and P52. Hence, the wirings P12, P22, P32, P42, and P52 of the wiring layers M1, M2, M3, M4, and M5 are connected in series by the vias V12, V21, V32, and V41. In addition, the wirings P12, P22, P32, P42, and P52 and the vias V12, V21, V32, and V41 form a zigzag-shaped wiring part in which the wirings P12, P22, P32, P42, and P52 are arranged and connected so as to turn around using the vias V12, V21, V32, and V41 as turn-around points.

In FIG. 3, the wiring P52 of the uppermost wiring layer M5 is connected to the power line VSS. Accordingly, the wirings P12, P22, P32, P42, and P52 and the vias V12, V21, V32, and V41 function as the second wiring part 40b.

The first end part of the wiring P11 is electrically connected to the register 20 through a via V01. Hence, the register 20 is connected to the power line VSS via the second wiring part 40b. The register 20 stores information "0" having the level in accordance with the low voltage VSS applied to the power line VSS.

In the first wiring part 40a and the second wiring part 40b, the vias arranged at the end parts of the wirings of each of the wiring layers M1 through M5 are formed at the same positions in a layer direction (or layer-thickness direction). For example, the via V21 that mutually connects the first end parts of the wirings P22 and P32 and the via V41 that mutually connects the first end parts of the wirings P41 and P51 are arranged on an axis O1 extending in a layer stacking direction of the wiring layers M1 through M5 (that is, a direction perpendicular to the wiring layers M1 through M5). In addition, the via V12 that mutually connects the second end parts of the wirings P12 and P22 and the via V32 that mutually connects the second end parts of the wirings P32 and P42 are arranged on an axis O2 extending in the layer stacking direction.

Similarly, the via V23 that mutually connects the second end parts of the wirings P21 and P31 and the via V43 that mutually connects the second end parts of the wirings P41 and P51 are arranged on an axis O3 extending in the layer stacking direction. Further, the via V14 that mutually connects the first end parts of the wirings P11 and P21 and the via V34 that mutually connects the first end parts of the wirings P31 and P41 are arranged on an axis O4 extending in the layer stacking direction.

The axes O1 through O4 on which each of the vias are arranged are set on vertexes of the rectangular shape. As illustrated in FIG. 5, the axes O1 through O4 are set on the vertexes of a rectangular shape R1 indicated by a dotted line. Accordingly, a distance LX between the axis O4 and the axis O1 (or between the axis O3 and the axis O2), and a distance LY between the axis O4 and the axis O3 (or between the axis O1 and the axis O2) are the same.

Next, a description will be given of a modification of the wirings in the wiring layers, and a modification of the code values due to the wirings, in the code setting unit 30.

Figure 4A:
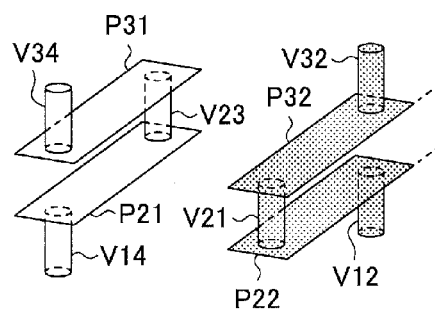
FIGS. 4A and 4B are perspective views for explaining a polarity inversion.

For example, FIG. 4A illustrates the wirings P21 and P31 and the vias V14, V23, and V34 connected thereto, and the wirings P22 and P32 and the vias V12, V21, and V32 connected thereto. In FIG. 4A, members applied with the low voltage VSS are indicated in halftone, similarly as in the case of FIG. 3.

Figure 4B:
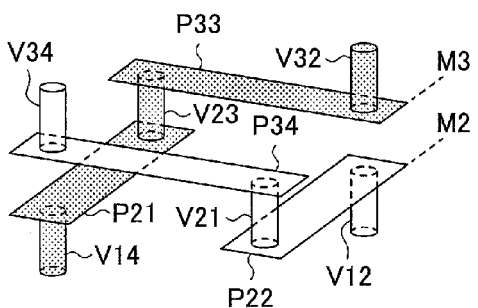

As illustrated in FIG. 4B, for example, the wirings P33 and P34 are formed based on the mask for the wiring layer M5. In FIG. 4B, members applied with the low voltage VSS are indicated in halftone, similarly as in the case of FIG. 4A. The wirings P33 and P34 illustrated in FIG. 4B extend in a direction (X-axis direction) different to a direction (Y-axis direction) in which the wirings P31 and P32 illustrated in FIG. 4A extend. The wiring P33 is electrically connected to the via V32 and the via V23. The via V23 is electrically connected to the via V14 through the wiring P21 of the lower wiring layer. The wiring P34 is electrically connected to the via V34 and the via V21. The via V21 is electrically connected to the via P12 through the wiring P22 of the lower wiring layer.

As illustrated in FIG. 3, the via V12 is connected to the register 20 through the wiring P12 and the via V01. Accordingly, the register 20 is connected to the power line VDD by forming the wirings P33 and P34 illustrated in FIG. 4A. The register 20 stores the code "1" in accordance with the level (high level) based on the high voltage VDD applied to the power line VDD.

Accordingly, the code stored in the register 20 illustrated in FIG. 3 can be changed from "0" to "1", by modifying the wirings P31 and P32 illustrated in FIG. 4A and extending in the Y-axis direction in the wiring layer M3 into the wirings P33 and P34 illustrated in FIG. 4B and extending in the X-axis direction.

In FIG. 3, the via V14 that mutually connects the wiring P11 of the first wiring layer M1 and the wiring P21 of the second wiring layer M2 above the wiring P11, and the via V12 that mutually connects the wiring P12 of the first wiring layer M1 and the wiring P22 of the second wiring layer M2 above the wiring P12, are arranged at one of two pairs of diagonal corners of the rectangular shape R1 illustrated in FIG. 5. In addition, the via 23 that mutually connects the wiring P21 of the second wiring layer M2 and the wiring P31 of the third wiring layer M3 above the wiring P21, and the via V21 that mutually connects the wiring P22 of the second wiring layer M2 and the wiring P32 of the third wiring layer M3 above the wiring P22, are arranged at the other of the two pairs of diagonal corners of the rectangular shape R1 illustrated in FIG. 5. Similarly, the vias V32 and V32 are arranged at the one of the two pairs of diagonal corners of the rectangular shape R1 illustrated in FIG. 5, and the vias V41 and V43 are arranged at the other of the two pairs of diagonal corners of the rectangular shape R1 illustrated in FIG. 5.

Accordingly, the wiring that is modified of the direction in which this wiring extends can be connected to the wirings of the other layers, similarly to the wiring before the modification. For example, as illustrated in FIG. 3, the wiring P31 of the third wiring layer M3 is connected to the wiring P21 of the lower wiring layer M2 through the via V23 at one end part of the wiring P31, and is connected to the wiring P41 of the upper wiring layer M4 through the via V34 at the other end part of the wiring P31. Similarly, the wiring P32 of the third wiring layer M3 is connected to the wiring P22 of the lower wiring layer M2 through the via V21 at one end part of the wiring P32, and is connected to the wiring P42 of the upper wiring layer M4 through the via V32 at the other end part of the wiring P32.

As illustrated in FIG. 4B, the wirings P33 and P34 that are modified of the directions in which these wirings P33 and P34 extend are formed on the third wiring layer M3. In this case, one end part of the wiring P33 is connected to the wiring P21 of the lower wiring layer M2 through the via V23, and the other end part of the wiring P33 is connected to the wiring P42 (illustrated in FIG. 3) of the upper wiring layer M4 through the via V32. Similarly, one end part of the wiring P34 is connected to the wiring P22 of the lower wiring layer M2 through the via V21, and the other end part of the wiring P34 is connected to the wiring P41 (illustrated in FIG. 3) of the upper wiring layer M4 through the via V34.

Accordingly, the connection relationship of the wirings in the code setting unit 30 can easily be modified by modifying the direction in which the wiring of the wiring layer extends. Depending on the connection relationship of the wirings, the code setting unit 30 connects the register to one of the power line VDD and the power line VSS. In other words, the connecting destination of the register 20 can easily be chanted between the power line VDD and the power line VSS. For this reason, the code value stored in the register 20 can easily be changed.

The modification of the wiring described above can be made not only in the wiring layer M3 described above, but may be made similarly in the wiring layers other than the wiring layer M3, and the information stored in the corresponding register can be changed according to the modification of the wiring.

Next, a description will be given on the changing of the information stored in the register, by referring to FIGS. 6A through 6D and FIGS. 7A through 7D. In FIGS. 6A through 6D and FIGS. 7A through 7D, reference numerals are added to the wirings that are modified from an initial state (first version), in order to facilitate understanding of the modifications made in the code setting unit 30. In FIGS. 6A through 6D and FIGS. 7A through 7D, members applied with the low voltage VSS are indicated in halftone, in order to facilitate understanding of the voltage level state in the code setting unit 30.

Figure 6A:
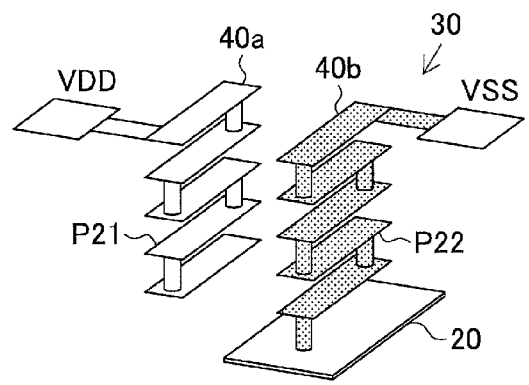
FIGS. 6A, 6B, 6C, and 6D are diagrams for explaining a wiring modification at a time of a revision.

FIG. 6A illustrates the code setting unit 30 in the initial state (first version). In this state, the register 20 stores the code "0" based on the low voltage VSS supplied through the code setting unit 30.

Figure 6B:
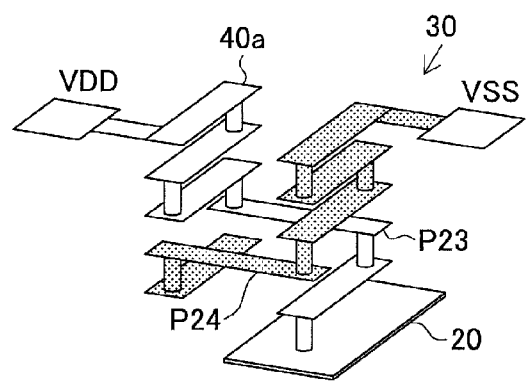

For example, the wiring of the second wiring layer M2 is modified by correcting the logic, improving the characteristic, or the like. In this case, the wirings P23 and P24 of the second wiring layer M2 are generated, as illustrated in FIG. 6B. Then, the register 20 is connected to the power line VDD of the high voltage VDD, through the first wiring part 40a including the wiring P23. Accordingly, the register 20 stores the code "1" based on the high voltage VDD.

Next, the version of the second wiring layer M2 is revised. In this case, the wirings P21 and P22 of the second wiring layer M2 are generated, as illustrated in FIG. 6A. In other words, the connection relationship of the code setting unit 30 can be returned to the initial state.

Figure 6C:
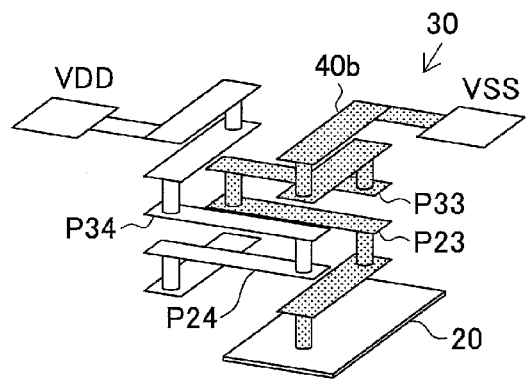

On the other hand, in the state of the code setting unit 30 illustrated in FIG. 6B, the version of the third wiring layer M3 is revised. In this case, the wirings P33 and P34 of the third wiring layer M3 are generated, as illustrated in FIG. 6C. Then, the register 20 is connected to the power line VSS of the low voltage VSS, through the second wiring part 40b including the wirings P23 and P33. Accordingly, the register 20 stores the code "0" based on the low voltage VSS.

Figure 6D:
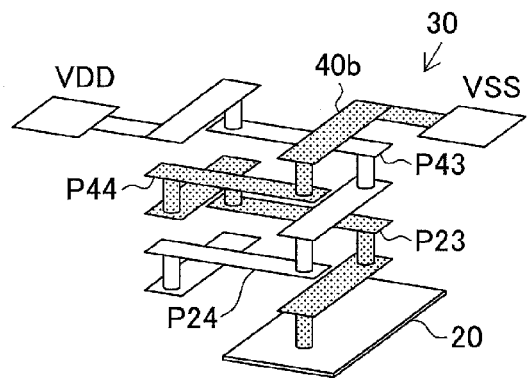

In addition, in the state of the code setting unit 30 illustrated in FIG. 6B, the version of the fourth wiring layer M4 is revised. In this case, the wirings P43 and P44 of the fourth wiring layer M4 are generated, as illustrated in FIG. 6D. Then, the register 20 is connected to the power line VSS of the low voltage VSS, through the second wiring part 40b including the wirings P23 and P44. Accordingly, the register 20 stores the code "0" based on the low voltage VSS.

Figure 7A:
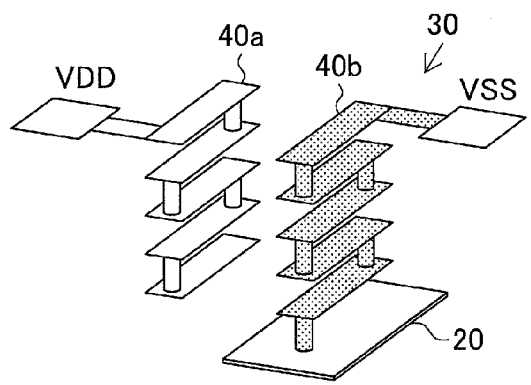
FIGS. 7A, 7B, 7C, and 7D are diagrams for explaining the wiring modification at the time of the revision.

FIG. 7A illustrates the code setting unit 30 in the initial state (first version). In this state, the register 20 stores the code "0" based on the low voltage VSS supplied through the code setting unit 30.

Figure 7B:
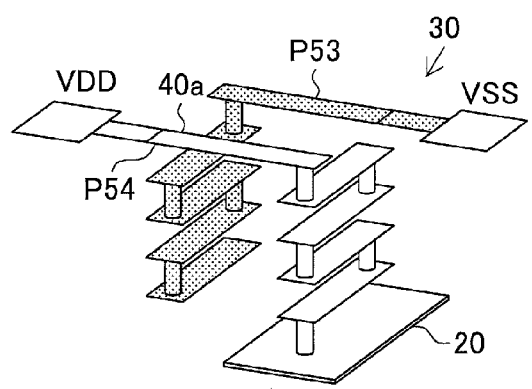

For example, the wiring of the fifth wiring layer M5 is modified. In this case, the wirings P53 and P54 of the fifth wiring layer M5 are generated, as illustrated in FIG. 7B. Then, the register 20 is connected to the power line VDD of the high voltage VDD, through the first wiring part 40a including the wiring P54. Accordingly, the register 20 stores the code "1" based on the high voltage VDD.

Figure 7C:
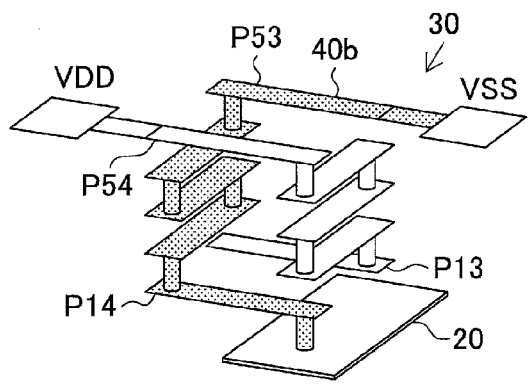

Next, the version of the first wiring layer M1 is revised. In this case, the wirings P13 and P14 of the first wiring layer M1 are generated, as illustrated in FIG. 7C. Then, the register 20 is connected to the power line VSS of the low voltage VSS, through the second wiring part 40b including the wirings P14 and P53. Accordingly, the register 20 stores the code "0" based on the low voltage VSS.

Figure 7D:
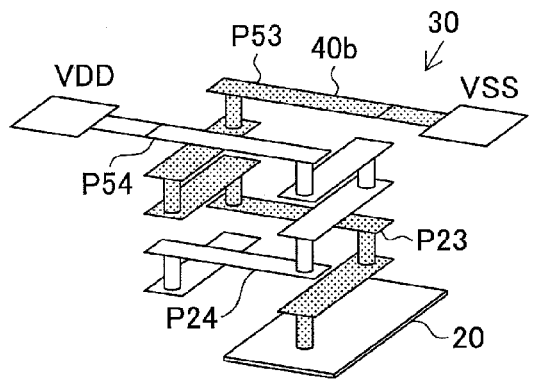

On the other hand, in the state of the code setting unit 30 illustrated in FIG. 7B, the version of the second wiring layer M2 is revised. In this case, the wirings P23 and P24 of the second wiring layer M2 are generated, as illustrated in FIG. 7D. Then, the register 20 is connected to the power line VSS of the low voltage VSS, through the second wiring part 40b including the wirings P23 and P53. Accordingly, the register 20 stores the code "0" based on the low voltage VSS.

Therefore, even in a case in which the version of the wiring of the code setting unit 30 is revised for one wiring layer amongst all of the wiring layers M1 through M5, the wiring of the revised wiring layer can be modified, in order to change the code stored in the register 20.

Next, a description will be given of the revision code in the code managing circuit 13.

In the second version, the wiring pattern is modified to correct the logic, improve the characteristic, or the like, and a mask in accordance with the modified wiring layer is created. In this case, it is assumed for the sake of convenience that the wiring layer (revised layer) having the modified wiring pattern is the fourth wiring layer M4.

Figure 8A:
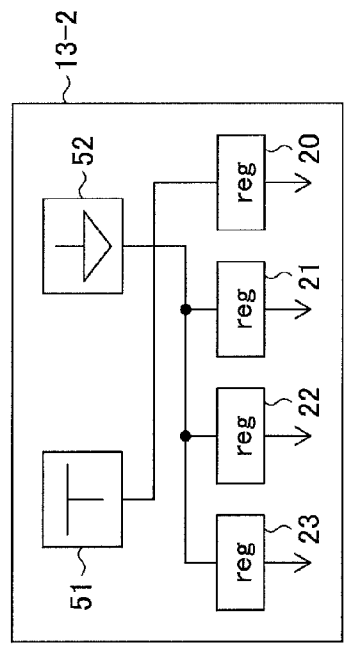
FIG. 8A is a block circuit diagram illustrating a version 2 code managing circuit.

As illustrated in FIG. 8A, the register 20 of a code managing circuit 13-2 is connected to the first voltage output circuit 51. The register 20 stores a value "1" based on the high voltage VDD supplied from the first voltage output circuit 51. The registers 21 through 23 are connected to the second voltage output circuit 52. The registers 21 through 23 store a value "0" based on the low voltage supplied from the second voltage output circuit 52.

Figure 8B:
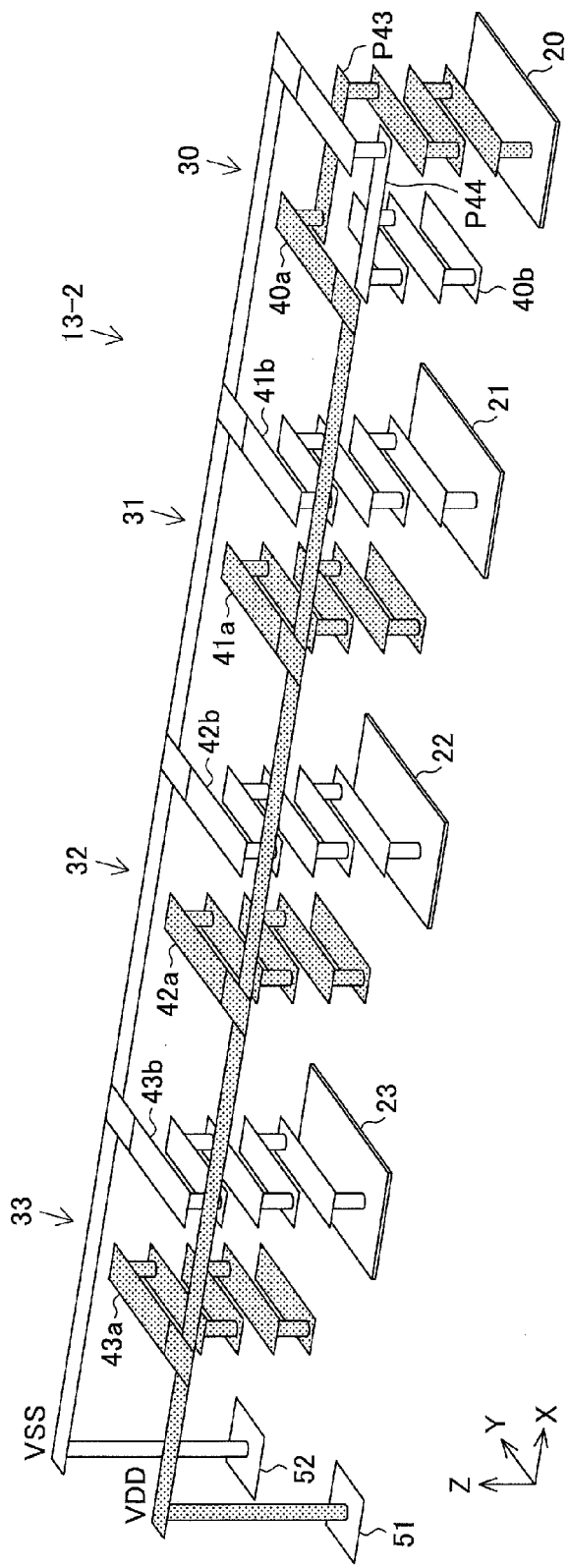
FIG. 8B is a perspective view illustrating the wiring structure of the version 2 code managing circuit.

As illustrated in FIG. 8B, a code managing circuit 13-2 includes the code setting units 30 through 33. In FIG. 8B, members applied with the high voltage VDD are indicated in halftone, in order to facilitate understanding of the voltage level state in each of the code setting units 30 through 33.

The code setting unit 30 includes the wirings P43 and P44 on the fourth wiring layer M4 and extending in the X-axis direction. The register 20 is connected to the power line VDD by the first wiring part 40a that includes the wiring P43. The register 20 stores a value "1" based on the high voltage VDD supplied from the power line VDD. The code setting units 31 through 33 remain in their initial states, as illustrated in FIG. 2A, and do not include wirings extending in the X-axis direction. Accordingly, each of the registers 21 through 23 is connected to the power line VSS, and stores a value "0". Hence, the registers 20, 21, 22, and 23 of the code managing circuit 13-2 store the values "0", "0", "0", and "1", respectively. Consequently, the code managing circuit 13-2 is set with a value "0001" indicating the second version, and outputs the revision code having this stored code value.

Next, as a third version, the wiring pattern is modified to correct the logic, improve the characteristic, or the like, and a mask in accordance with the modified wiring layer is created. In this case, it is assumed for the sake of convenience that the wiring layer (revised layer) having the modified wiring pattern is the second wiring layer M2.

Figure 9A:
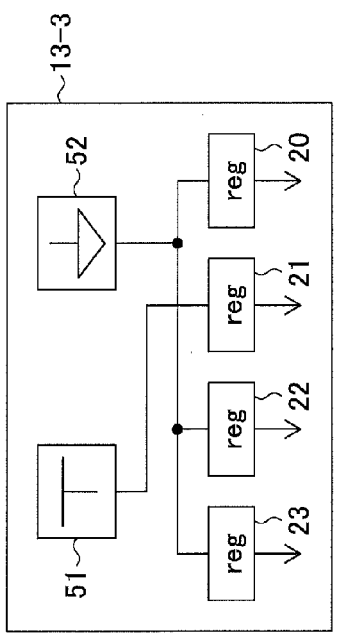
FIG. 9A is a block circuit diagram illustrating a version 3 code managing circuit.

As illustrated in FIG. 9A, the register 20 of a code managing circuit 13-3 is connected to the second voltage output circuit 52. The register 20 stores a value "0" based on the low voltage VSS supplied from the second voltage output circuit 52. The register 21 is connected to the first voltage output circuit 51. The register 21 stores a value "1" based on the high voltage VDD supplied from the first voltage output circuit 51. The registers 22 and 23 are connected to the second voltage output circuit 52. The registers 22 and 23 respectively store a value "0" based on the low voltage VSS supplied from the second voltage output circuit 52.

Figure 9B:
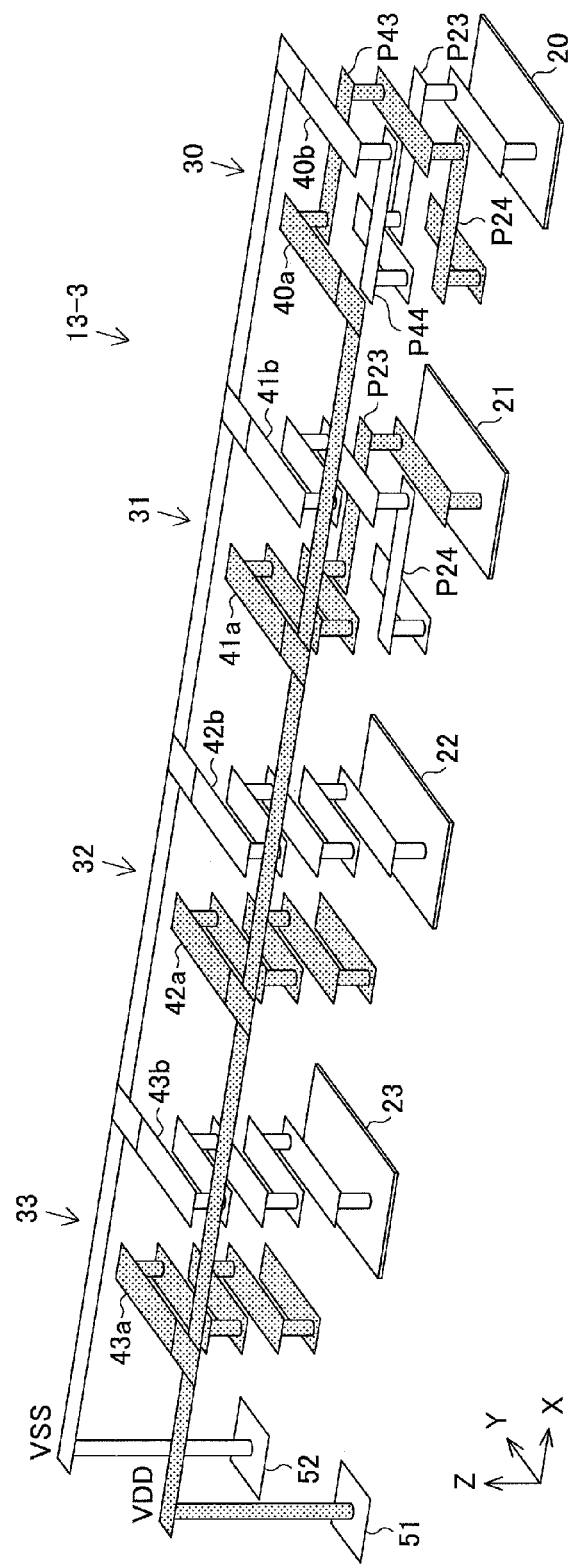
FIG. 9B is a perspective view illustrating the wiring structure of the version 3 code managing circuit.

As illustrated in FIG. 9B, the code managing circuit 13-3 includes the code setting units 30 through 33. In FIG. 9B, members applied with the high voltage VDD are indicated in halftone, in order to facilitate understanding of the voltage level state in each of the code setting units 30 through 33.

The code setting unit 30 includes the wirings P43 and P44 on the fourth wiring layer M4 and extending in the X-axis direction, and the wirings P23 and P24 on the second wiring layer M2 and extending in the X-axis direction. The register 20 is connected to the power line VSS by the second wiring part 40b that includes the wiring P23 of the second wiring layer M2 and the wiring P44 of the fourth wiring layer M4. The register 20 stores a value "0" based on the low voltage VSS supplied from the power line VSS. The code setting unit 31 includes the wirings P23 and P24 on the second wiring layer M2 and extending in the X-axis direction. The register 21 is connected to the power line VDD by the first wiring part 41a that includes the wiring P23. The register 21 stores a value "1" based on the high voltage VDD supplied form the power line VDD. The code setting units 32 and 33 remain in their initial states, as illustrated in FIG. 2A, and do not include the wirings extending in the X-axis direction. Accordingly, each of the registers 22 and 23 is connected to the power line VSS and stores a value "0". Hence, the registers 20, 21, 22, and 23 of the code managing circuit 13-3 store the values "0", "0", "0", and "1", respectively. Consequently, the code managing circuit 13-3 is set with a value "0001" indicating the second version, and outputs the revision code having this stored code value.

Therefore, by modifying the wirings on a predetermined wiring layer amongst all of the wiring layers M1 through M5, the information stored in the registers 20 through 23 may be changed to toggle between the values "0" and "1". In the semiconductor device 10 illustrated in FIG. 1, this predetermined wiring layer is the wiring layer that includes the wiring layer to be modified in order to correct the logic, improve the characteristic, or the like. Hence, in a case in which the wiring is modified in a plurality of wiring layers, one of these plurality of wiring layers may be regarded as this predetermined wiring layer, that is, the wiring layer (revised layer) that is specified in order to change the revision code in the code managing circuit 13.

(Modification)

Figure 10A:
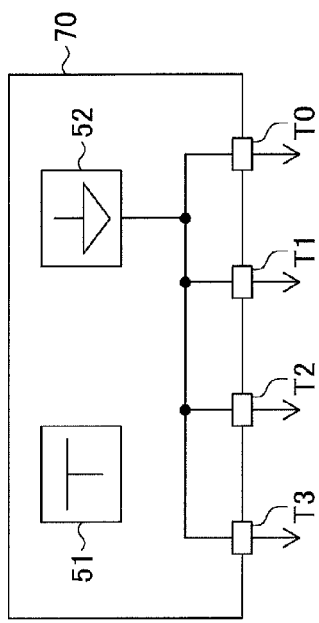
FIG. 10A is a block circuit diagram illustrating another code managing circuit.

As illustrated in FIG. 10A, in a code managing circuit 70, the second voltage output circuit 52 is connected to 4 output terminals T0, T1, T2, and T3 in accordance with the number of bits of the revision code. On the other hand, the first voltage output circuit 51 is not connected to an output terminal. This code managing circuit 70 outputs a revision code having a value "0000", based on the low voltage VSS from the second voltage output circuit 52.

Figure 10B:
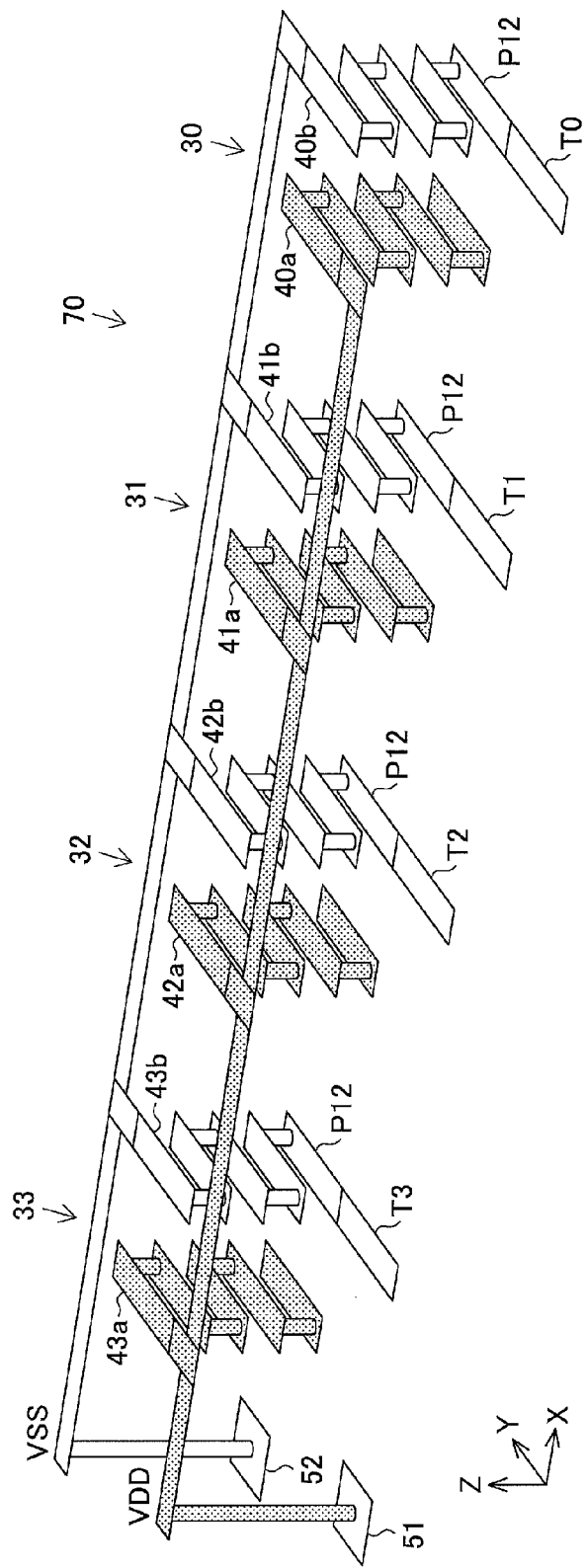
FIG. 10B is a perspective view illustrating the wiring structure of the other code managing circuit.

As illustrated in FIG. 10B, the code managing circuit 70 includes 4 code setting units 30, 31, 32, and 33 in accordance with the number of bits of the revision code, similarly as in the case of the code managing circuit 13-1 illustrated in FIG. 2B. In FIG. 10B, members applied with the high voltage VDD are indicated in halftone, in order to facilitate understanding of the voltage level state in each of the code setting units 30 through 33.

In each of the code setting units 30 through 33, the wiring P12 of the first wiring layer M1 (lowermost wiring layer illustrated in FIG. 10B) is connected to a corresponding one of the output terminals T0 through T3. The output terminals T0 through T3 are wirings formed on the first wiring layer M1. The high voltage VDD or the low voltage VSS is supplied with respect to the output terminals T0 through T3 by forming the wirings in accordance with a mask that is used to manufacture the semiconductor device including the code managing circuit 70. Accordingly, the code managing circuit 70 outputs a revision code in accordance with the voltage supplied to each of the output terminals T0 through T3.

Next, a description will be given of a method of designing the semiconductor device 10 described above.

(Designing Apparatus)

Figure 11:
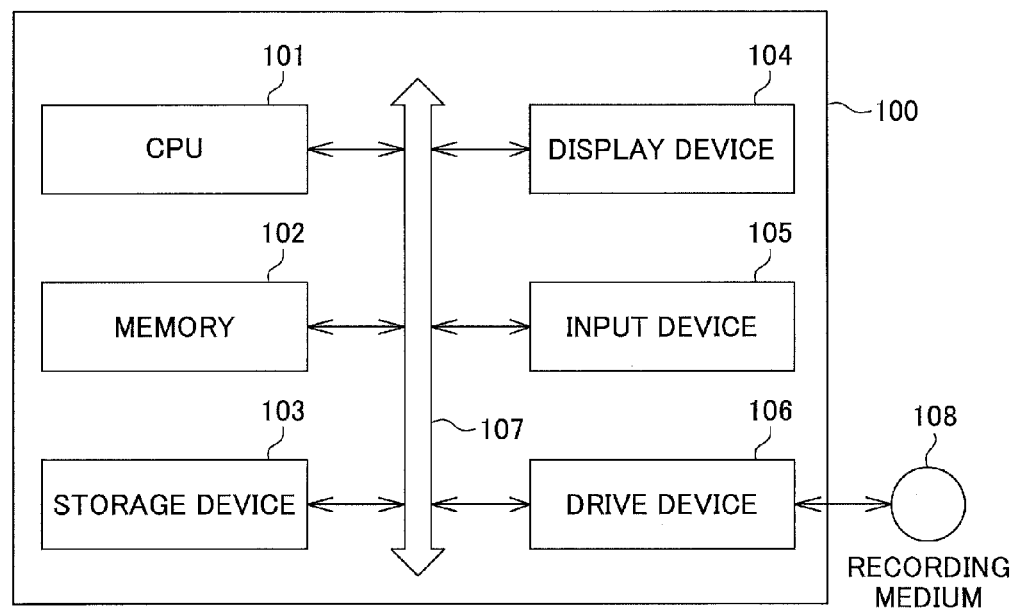
FIG. 11 is a diagram schematically illustrating a configuration of a designing apparatus.

FIG. 11 is a diagram schematically illustrating a configuration of an example of a designing apparatus 100 for designing the semiconductor device 10.

The designing apparatus 100 is a general CAD (Computer Aided Design) apparatus, and generates design data of a semiconductor device. The design data includes layout data, mask pattern data, revision information, or the like of the semiconductor device.

The designing apparatus 100 includes a CPU 101, a memory 102, a storage device 103, a display device 104, an input device 105, and a drive device 106 that are mutually connected via a bus 107.

The CPU 101 is an example of a processor that executes a design program using the main storage 102, and performs a process required to design the semiconductor device. The memory 102 is an example of a main storage, and may include a cache memory, a system memory, a display (or graphic) memory, or the like.

The display device 104 is used to display design results, a design condition input screen, or the like. The display device 104 may be formed by a CRT (Cathode Ray Tube), an LCD (Liquid Crystal Display), a PDP (Plasma Display Panel), or the like. The input device 105 is used by a user to input requests or instructions, processing conditions, or the like. The input device 105 may include a keyboard, a mouse, or the like.

The storage device 103 may be formed by a magnetic disk drive, an optical disk drive, a magneto-optical disk drive, an SSD (Solid State Drive), or the like. The storage device 103 may store the design program for designing the wirings, and various kinds of data files (hereinafter also simply referred to as "files"). The CPU 101 transfers the design program and data stored in the various kinds of files to the memory 102, when necessary, in response to an instruction received from the input device 105, and successively execute the design program. The storage device 103 may also be used as a database.

The design program that is executed by the CPU 101 and the layout data used by the CPU 101 may be provided by a recording medium 108. The recording medium 108 may be loaded into the drive device 106. The layout data may be stored in the storage device 103.

The recording medium 108 may be formed by any suitable non-transitory computer-readable storage medium, including a memory card, a flexible disk, an optical disk (CD-ROM, DVD-ROM, etc.), a magneto-optical disk (MO, MD, etc.), or the like. The design program may be stored in the recording medium 108, and loaded into the memory 102 via the drive device 106 to be used when necessary. The recording medium 108 that provides the design program and the data files may be an external storage device, or a recording medium loaded into an external drive device, provided externally to the designing apparatus 100. For example, the external storage device may be included in an external computer, an external server, or the like. The external storage device and the external drive device may be connected to the designing apparatus 100 via a network, and the design program and the data files may be downloaded to the storage device 103 via the network.

The storage device 103 of the designing apparatus 100 may store design information on the semiconductor device 10. The design information may include specifications, netlists, or the like of the semiconductor device 10. In addition, the storage device 103 may store a library (or cell library) that includes logic cells, macro cells, or the like.

The designing apparatus 100 generates the layout data of the semiconductor device 10 according to various information stored in the storage device 103. For example, the designing apparatus 100 arranges the cells read from the library according to specification information, and arranges the wirings and the vias of the multilayer interconnection structure according to the netlist. The designing apparatus 100 generates pattern data of the semiconductor device 10. The mask is created based on the pattern data, and the semiconductor device 10 is manufactured using the mask.

This semiconductor device 10 is manufactured based on the first version of the mask, and includes the code managing circuit 13-1 illustrated in FIG. 2B, for example.

The storage device 103 stores a management table MT in accordance with the code managing circuit 13-1. The management table MT stores data indicating the states of the wirings of all code setting units 30 included in the code managing circuit 13-1. The management table MT manages pattern information of the wiring patterns, in a matrix arrangement according to each wiring layer and each bit, based on the bits and the wiring layers of each of the code setting units 30.

The library in the storage device 103 stores the data of the code setting unit 30 illustrated in FIG. 2B, for example, as wiring cells, for example. The designing apparatus 100 arranges the wiring cells (code setting units 30) read from the library, based on the design information of the semiconductor device 10.

The wiring cells forming the code setting unit 30 is registered as programmable macro cells, for example. The layout data of the code setting unit 30, including the wirings of the wiring layers according to the specifications (the number of wiring layers, the number of bits of the version code that is set, etc.) of the semiconductor device 10 to be generated, may be generated based on input parameters, that is, information such as the number of wiring layers, the number of units, the power lines to be connected, or the like.

In addition, the library in the storage device 103 stores the wiring cells for forming the wirings of the wiring layers, in the code setting unit 30 illustrated in FIG. 2B.

FIGS. 13A and 13B illustrate examples of a wiring cell CE1 and a wiring cell CE2, respectively.

The wiring cell CE1 includes 2 wirings P1 and P2 extending parallel to each other along a predetermined direction (for example, the Y-axis direction). These wirings P1 and P2 extend in the same direction as each of the wirings of the code setting unit 30 illustrated in FIG. 2B. In other words, by using the wiring cell CE1 including these wirings P1 and P2, the wirings (for example, the wirings P31 and P32 illustrated in FIG. 4A) of a predetermined wiring layer are formed. In the following description, the wiring cell CE1 may also be referred to as a wiring pattern "A".

The wiring cell CE2 includes wirings P3 and P4 extending parallel to each other along a direction (for example, the X-axis direction) different from the predetermined direction in which the wirings P1 and P2 of the wiring cell CE1 extend. In this example, the wirings P3 and P4 extend in the direction perpendicular to the predetermined direction. These wirings P3 and P4 extend in the same direction as the wirings P33 and P34 illustrated in FIG. 4B. In other words, by using the wiring cell CE2 including these wirings P3 and P4, the wirings P33 and P34 illustrated in FIG. 4B are formed. In the following description, the wiring cell CE2 may also be referred to as a "wiring pattern "B".

The library described above includes cells forming the data of the wirings or the like in a hierarchical structure. For example, the data of the code setting unit 30 illustrated in FIG. 2B is set so as to refer to the wiring cell CE1 illustrated in FIG. 13A and to arrange the wiring cell CE1 in each wiring layer.

The layout data of the semiconductor device 10 illustrated in FIG. 1 is revised, based on a circuit correction (modification of the logic level) according to modifications in the specification, such as an addition of a function and a modification of a characteristic, and results of inspecting operations. The storage device 103 of the designing apparatus 100 illustrated in FIG. 11 stores layer information indicating the revised wiring layers, and the revision code in accordance with the version number of the revised version. The designing apparatus 100 modifies the wirings of the code managing circuit 13-1 based on the layer information and the revision code, and sets the revision code in the code managing circuit 13-1.

Next, a description will be given of a process of the designing apparatus 100 illustrated in FIG. 11 when modifying the wiring pattern in the revised layer, by referring to FIG. 12.

Figure 12:
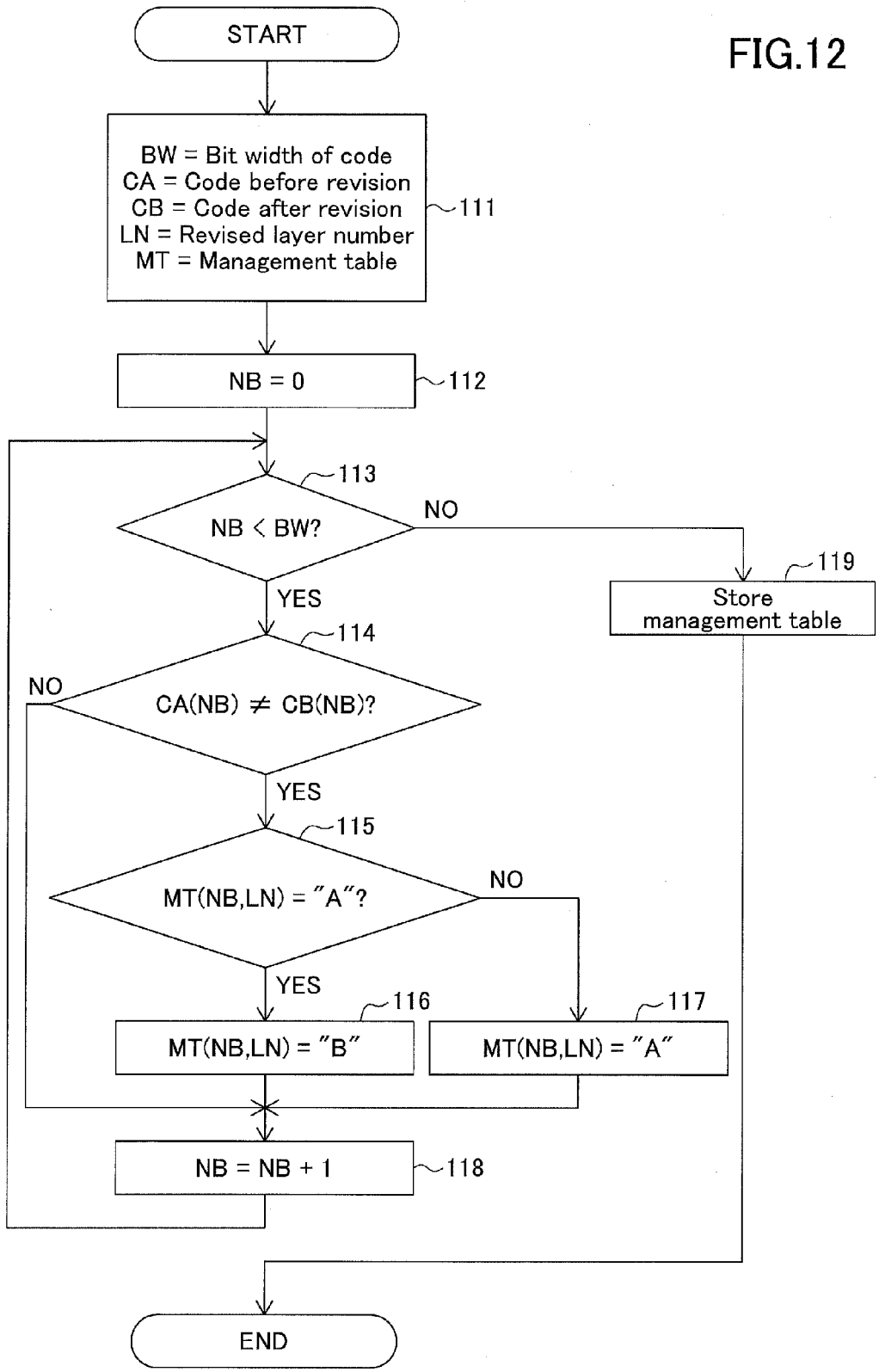
FIG. 12 is a flow chart for explaining a code modifying process.

In step 111 illustrated in FIG. 12, an initial setting is carried out. In the initial setting, the designing apparatus 100 illustrated in FIG. 11 reads various kinds of parameters from the storage device 103. The parameters include a code CA before the revision, a code CB after the revision, a bit width BW of the codes CA and CB, a revised layer number LN, and the management table MT.

Next, in step 112, a bit counter NB is initialized to NB=0.

Next, in step 113, the bit counter NB and the bit width BW are compared. When the bit counter NB is smaller than the bit width BW (NB<BW) and a judgment result in step 113 is YES, the process advances to step 114. In other words, while the bit counter NB is smaller than the bit width BW, processes of steps 114 through 118 are repeated. Hence, the designing apparatus 100 confirms and modifies the wiring pattern for each bit of the code CA before the revision and the code CB after the revision.

In step 114, a bit value CA(NB) of the bit counter NB of the code CA before the revision and a bit value CB(NB) of the bit counter NB of the code CB after the revision are compared. When the bit values CA(NB) and CB(NB) do not match and a judgment result in step 114 is YES, the process advances to step 115. On the other hand, when the bit values CA(NB) and CB(NB) match and the judgment result in step 114 is NO, the process advances to step 118.

In step 115, a judgment is made to determine whether the wiring pattern of the management table MT (management table MT(NB,LN)) specified by the bit counter NB and the revised layer number LN is the wiring pattern "A". When the specified wiring pattern is the wiring pattern "A" and a judgment result in step 115 is YES, the process advances to step 116. In step 116, the wiring pattern "B" is set in the management table MT(NB,LN), and the process advances to step 118.

On the other hand, when the specified wiring pattern is not the wiring pattern "A" and the judgment result in step 115 is NO, the process advances to step 117. In step 117, the wiring pattern "A" is set in the management table MT(NB, LN), and the process advances to step 118.

In other words, the designing apparatus 100 performs the processes of steps 115 through 117 to switch the wiring pattern in the management table MT(NB,LN) specified by the bit counter NB and the revised layer number LN between the wiring pattern "A" and the wiring pattern "B".

In step 116 described above, the designing apparatus 100 modifies the layout data of the semiconductor device 10. The layout data includes the pattern data, such as the cells, the wirings, the vias, or the like used in the semiconductor device 10. The wiring pattern "A" includes the wirings P1 and P2 extending along the X-axis direction, as illustrated in FIG. 13A. On the other hand, the wiring pattern "B" includes the wirings P3 and P4 extending along the Y-axis direction, as illustrated in FIG. 13B. Accordingly, the designing apparatus 100 modifies the directions in which the first wiring and the second wiring extend in the revised layer, by performing the processes of steps 115 through 117.

Next, in step 118, the designing apparatus 100 increments the bit counter NB by "1", and the process returns to step 113.

In step 113, when the bit counter NB is greater than or equal to the bit width (NB>=BW) and the judgment result in step 113 is NO, the process advances to step 119. The bit counter NB is "0" by the initialization described above. In other words, the wiring pattern is set with respect to the first bit (bit 0) of the code CA before the revision and the code CB after the revision. In addition, by incrementing the bit counter NB by "1", a process similar to that described above is performed with respect to the second bit (bit 1) of each of the code CA before the revision and the code CB after the revision. When the bit counter NB becomes greater than the bit width BW and the process is performed with respect to all of the bits of each of the code CA before the revision and the code CB after the revision, the process advances to step 119.

In step 119, the designing apparatus 100 stores the management table MT in the storage device 103 illustrated in FIG. 11.

The designing apparatus 100 generates the layout data of the semiconductor device 10, based on the data in the management table MT. The mask in accordance with the wiring layer to be modified is generated based on the layout data. The semiconductor device 10 is manufactured using the generated mask.

FIG. 14A illustrates a state of the management table MT corresponding to the first version of the semiconductor device 10. This management table MT is a matrix table that stores each bit [3:0] of the version code, and information of the wiring patterns in accordance with the wiring layers M1 through M5 of the semiconductor device 10. The wiring patterns correspond to the wiring structure of the code setting units 30 through 33 included in the code managing circuit 13-1 illustrated in FIG. 2B. In FIG. 14A, "A" represents the wiring cell CE1 (wiring pattern "A") illustrated in FIG. 13A.

For example, in the semiconductor device 10 illustrated in FIG. 1, the wirings of the fifth wiring layer M5 are modified in the second version, in order to correct the logic, improve the characteristic, or the like. Accordingly, the revised layer number LN is "5". In addition, the code CA before the revision is "0000", and the code CB after the revision is "0001".

The designing apparatus 100 illustrated in FIG. 11 initializes the bit counter NB to NB=0. In addition, the designing apparatus 100 counts up the bit counter NB, and successively compares each bit of the code CA before the revision and the code CB after the revision. First, the designing apparatus 100 compares the first bits (bit 0). In this state, the code CA before the revision is "0" and the code CB after the revision is "1". Hence, the designing apparatus 100 judges the wiring pattern of the revised layer number LN (LN=5) at the first bit (bit 0). In this state, the wiring pattern of the management table MT(NB,LN) is "A". Accordingly, the designing apparatus 100 sets the wiring pattern "B" at the corresponding position, as illustrated in FIG. 14B. Next, the designing apparatus 100 compares the second bits (bit 1). In this state, the code CA before the revision is "0", and the code CB after the revision is "0". Hence, the designing apparatus 100 does not modify the wiring pattern at the second bit (bit 1). Processes similar to those described above are performed for the third bit (bit 2) and the fourth bit (bit 3). In this manner, the designing apparatus 100 sets the wiring pattern "B" in the management table MT, based on the result of comparing the code CA before the revision and the code CB after the revision, and the revised layer number LN. The designing apparatus 100 stores the management table MT in the storage device 103 illustrated in FIG. 11.

Next, the wirings of the second wiring layer M2 are modified in the third version, in order to correct the logic, improve the characteristic, or the like. Accordingly, the revised layer number LN is "2". In addition, the code CA before the revision is "0001", and the code CB after the revision is "0010".

FIG. 15A illustrates a state of the management table MT corresponding to the second version of the semiconductor device 10. In this management table MT, the wiring pattern "B" is set at the first bit (bit 0) of the fifth wiring layer M5.

The designing apparatus 100 illustrated in FIG. 11 initializes the bit counter NB to NB=0. Then, the designing apparatus 100 counts up the bit counter NB, and successively compares each bit of the code CA before the revision and the code CB after the revision. First, the designing apparatus 100 compares the first bits (bit 0). In this state, the code CA before the revision is "1" and the code CB after the revision is "0". Hence, the designing apparatus 100 judges the wiring pattern of the revised layer number LN (LN=2) at the first bit (bit 0). In this state, the wiring pattern of the management table MT(NB,LN) is "A". Accordingly, the designing apparatus 100 sets the wiring pattern "B" at the corresponding position, as illustrated in FIG. 15B.

Next, the designing apparatus 100 compares the second bits (bit 1). In this state, the code CA before the revision is "0", and the code CB after the revision is "1". Hence, the designing apparatus 100 judges the wiring pattern of the revised layer number LN (LN=2) at the second bit (bit 1). In this state, the wiring pattern of the management table MT(NB,LN) is "A". Accordingly, the designing apparatus 100 sets the wiring pattern "B" at the corresponding position, as illustrated in FIG. 15C.

Next, the designing apparatus 100 compares the third bits (bit 2). In this state, the code CA before the revision is "0", and the code CB after the revision is "0". Hence, the designing apparatus 100 does not modify the wiring pattern at the third bit (bit 2). The process is the same for the fourth bit (bit 3). In this manner, the designing apparatus 100 sets the wiring pattern "B" in the management table MT, based on the result of comparing the code CA before the revision and the code CB after the revision, and the revised layer number LN. The designing apparatus 100 stores the management table MT in the storage device 103 illustrated in FIG. 11.

Accordingly, the revision code can be changed from "0000" to "0001", and further, from "0001" to "0010". The wiring states of the wiring layers in each of the code setting units 30 through 33 illustrated in FIG. 2B can be set arbitrarily. For this reason, the code CB after the revision is not limited to being incremented by "1" for every revision, but may be set to an arbitrary value. For example, with respect to the code CA before the revision that is "0000", the code CB after the revision may be set to "0100". The connection state in each of the code setting units 30 through 33 can be modified according to the code CA before the revision and the code CB after the revision that may be set in the manner described above.

According to the embodiments and modification described above, the following advantageous features (F1) through (F3) can be obtained.

(F1) The code setting unit 30 of the code managing circuit 13 is connected to the power line VDD and the power line VSS. The code setting unit 30 includes the wirings P11, P12, P21, P22, P31, P32, P41, P42, P51, and P52 arranged in the first through fifth wiring layers M1 through M5. The wirings P11 and P12 of the first wiring layer M1 are connected to the wirings P21 and P22 of the upper second wiring layer M2 through vias V14 and V12 located at mutually different end parts. Similarly, the wirings P21 and P22 of the second wiring layer M2, the wirings P31 and P32 of the third wiring layer M3, and the wirings P41 and P42 of the fourth wiring layer M4 are connected to the wirings P31 and P32 of the upper third wiring layer M3, the wirings P41 and P41 of the upper fourth wiring layer M4, and the wirings P51 and P52 of the upper fifth wiring layer M5, respectively, through the vias V23 and V21, the vias V34 and V32, and the vias V43 and V41, respectively, located at mutually different end parts. The wirings of each wiring layer is connected to the wirings of the upper or lower wiring layer, through the vias located at the end parts along mutually different directions. For example, the wiring P21 of the second wiring layer M2 is connected to the wiring P31 of the upper third wiring layer M3, through the via V23 located at the second end part. In addition, the wiring P22 of the second wiring layer M2 is connected to the wiring P32 of the upper third wiring layer M3, through the via 21 located at the first end part.

The wirings of the code setting unit 30 are formed using the mask for making the revision in order to correct the logic, improve the characteristic, or the like of the semiconductor device 10. For example, in a case in which the third wiring layer M3 is revised, the wirings P33 and P34 are formed on the third wiring layer M3, as illustrated in FIG. 4B. These wirings P33 and P34 extend in the direction (X-axis direction) different from the direction (Y-axis direction) in which the wirings P31 and P32 before the revision extend as illustrated in FIG. 4A. The connection relationship with respect to the wirings P21 and P22 of the lower wiring layer M2 is switched by the wirings P33 and P34. Accordingly, the voltage supplied with respect to the register 20 that connects to the code setting unit 30 changes. The register 20 stores the code "0" or "1", based on the voltage (low voltage VSS or high voltage VDD) supplied thereto.

Therefore, because the revision code can be changed in the same wiring layer on which the wiring pattern is modified in order to correct the logic, improve the characteristic, or the like, the revision code can be changed by simply modifying the wiring pattern of one of the wiring layers. As a result, the number of masks that need to be created with every revision can be reduced, and the increase in the cost can be suppressed.

(F2) In the code setting unit 30, the wirings P23 and P24 are formed by the revision of the second wiring layer M2, as illustrated in FIGS. 6A through 6D. The register 20 stores the code "1", based on the high voltage VDD supplied from the wiring P23 that is generated. In addition, the wirings P33 and P34 are formed by the revision of the third wiring layer M3. The register 20 stores the code "0", based on the low voltage supplied from the wiring P33 that is generated. Hence, in the code setting unit 30, it is possible to set the code "0" or "1", based on the wiring that is formed by the revision in a different wiring layer. For this reason, it is possible to cope with 16 revisions (that is, 16 times) by the 4 code setting units 30 through 33, and an increase in an area required to set the revision code can be suppressed.

(F3) The code managing circuit 13 includes 4 code setting units 30 through 33. The state of the wirings of each of the wiring layers can be set arbitrarily in each of the code setting units 30 through 33. For this reason, the code CB after the revision is not limited to being incremented by "1" for every revision, but may be set to an arbitrary value. For example, with respect to the code CA before the revision that is "0000", the code CB after the revision may be set to "0100". The connection state in each of the code setting units 30 through 33 can be modified according to the code CA before the revision and the code CB after the revision that may be set in the manner described above.

Further modifications of the embodiments may be made as follows.

For example, although the code managing circuit 13 of the described embodiments stores a 4-bit revision code, the number of bits of the revision code that is stored may be 3 bits or less, and may be 5 bits or more, that is, the number of bits of the revision code may be set arbitrarily.

In the embodiments described above, a code value "0" is set in each unit according to the low voltage VSS in the initial state (first version). However, a code value "1" may be set in each unit according to the high voltage VDD in the initial state (first version).

As illustrated in FIG. 2B, the code managing circuit 13 in the described embodiment includes the code setting units 30 through 33 that are arranged along the power lines VDD and VSS. However, the code setting units may be arranged in a matrix arrangement, similarly as in the case of a ROM (Read Only Memory), for example, so as to form a storage part for storing the fixed values of the semiconductor device.

According to each of the embodiments and modifications described above, it is possible to reduce the cost associated with the revision.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of designing a semiconductor device comprising:
    modifying, by a computer, a direction in which first and second wirings extend in a first wiring layer from among a plurality of wiring layers of the semiconductor device that is specified by layer information stored in a storage of the computer;
    to modify a connection relationship of third and fourth wirings with respect to the first and second wirings in a second wiring layer from among the plurality of wiring layers;
    storing, in accordance with the modified connection relationship, and via the computer, a management code in a register, the register being provided within a code managing circuit of the semiconductor device and being electrically connected to the first wiring; and
    generating layout data for the semiconductor device based on the management code, wherein a mask used to manufacture the semiconductor device is generated based on the layout data.

2. The method of designing the semiconductor device as claimed in claim 1, wherein the management code includes a plurality of bits based on 1-bit information set in each of a plurality of setting parts of the semiconductor device, and wherein the method further comprises:

storing, in a memory, a first code set in the code managing circuit, a second code to be set in the code managing circuit, and the layer information specifying the wiring layers to be modified; and modifying, by the computer, the direction in which the first and second wirings of each wiring layer specified by the layer information extend in each setting part, based on a result of comparing each of corresponding bits of the first code and the second code.

3. The method of designing the semiconductor device as claimed in claim 2, wherein the method further comprises:

storing, in the memory, a pattern table of wiring patterns in accordance with the directions in which the first and second wiring layers extend, based on the plurality of bits and the plurality of wiring layers; and modifying the wiring patterns in accordance with the layer information in the pattern table, based on the result of comparing each of corresponding bits of the first code and the second code.

4. The method of designing the semiconductor device as claimed in claim 2, wherein the method further comprises:

storing, in the code managing circuit, a revision code based on a modification log of the semiconductor device, and wherein the layer information is related to a layer of a mask that is revised based on a modification of a circuit included in the semiconductor device.

5. The method of designing the semiconductor device as claimed in claim 1, wherein the register is formed on a substrate of the semiconductor device, and stores information based on one of mutually different first and second voltages supplied according to a connection of the first wiring.

6. The method of designing the semiconductor device as claimed in claim 5, wherein the third wiring forms a first power line supplied with the first voltage, and the fourth wiring forms a second power line supplied with the second voltage.

7. A designing apparatus that designs a semiconductor device, the designing apparatus comprising:

a storage configured to store a program and layer information; and a processor configured to execute the program and perform a process, wherein the process includes:

modifying a direction in which first and second wirings extend in a first wiring layer from among a plurality of wiring layers of the semiconductor device that is specified by the layer information stored in the storage to modify a connection relationship of third and fourth wirings with respect to the first and second wirings in a second wiring layer from among the plurality of wiring layers; and storing, in accordance with the modified connection relationship, and via the processor, a management code in a register, the register being provided within a code managing circuit of the semiconductor device and being electrically connected to the first wiring; and generating layout data for the semiconductor device based on the management code, wherein a mask used to manufacture the semiconductor device is generated based on the layout data.

8. The designing apparatus as claimed in claim 7, the management code circuit includes a plurality of bits based on 1-bit information set in each of a plurality of setting parts of the semiconductor device, and wherein the process further comprises:

storing, in the storage, a first code set in the code managing circuit, a second code to be set in the code managing circuit, and the layer information specifying the wiring layers to be modified; and modifying the direction in which the first and second wirings of each wiring layer specified by the layer information extend in each setting part, based on a result of comparing each of corresponding bits of the first code and the second code.

9. The designing apparatus as claimed in claim 8, wherein the process further comprises:

storing, in the storage, a pattern table of wiring patterns in accordance with the directions in which the first and second wiring layers extend, based on the plurality of bits and the plurality of wiring layers; and modifying the wiring patterns in accordance with the layer information in the pattern table, based on the result of comparing each of corresponding bits of the first code and the second code.

10. The designing apparatus as claimed in claim 8, wherein the process further comprises:

storing, in the code managing circuit, a revision code based on a modification log of the semiconductor device, and wherein the layer information is related to a layer of a mask that is revised based on a modification of a circuit included in the semiconductor device.

11. The designing apparatus as claimed in claim 7, wherein the register is formed on a substrate of the semiconductor device, and stores information based on one of mutually different first and second voltages supplied according to a connection of the first wiring.

12. The designing apparatus as claimed in claim 11, wherein the third wiring forms a first power line supplied with the first voltage, and the fourth wiring forms a second power line supplied with the second voltage.

13. A non-transitory computer-readable storage medium having stored therein a program for causing a computer to execute a semiconductor device designing process, wherein the semiconductor device designing process includes:

modifying a direction in which first and second wirings extend in a first wiring layer from among a plurality of wiring layers of the semiconductor device that is specified by layer information stored in a storage of the computer to modify a connection relationship of third and fourth wirings with respect to the first and second wirings in a second wiring layer from among the plurality of wiring layers; and storing, in accordance with the modified connection relationship, and via the computer, a management code in a register, the register being provided within a code managing circuit of the semiconductor device and being electrically connected to the first wiring; and generating layout data for the semiconductor device based on the management code, wherein a mask used to manufacture the semiconductor device is generated based on the layout data.

14. The non-transitory computer-readable storage medium as claimed in claim 13,
wherein the management code includes a plurality of bits based on 1-bit information set in each of a plurality of setting parts of the semiconductor device, and wherein the semiconductor device designing process further includes:
storing a first code set in the code managing circuit, a second code to be set in the code managing circuit, and the layer information specifying the wiring layers to be modified; and
modifying the direction in which the first and second wirings of each wiring layer specified by the layer information extend in each setting part, based on a result of comparing each of corresponding bits of the first code and the second code.

15. The non-transitory computer-readable storage medium as claimed in claim 14, wherein the semiconductor device designing process further includes:
storing a pattern table of wiring patterns in accordance with the directions in which the first and second wiring layers extend, based on the plurality of bits and the plurality of wiring layers; and
modifying the wiring patterns in accordance with the layer information in the pattern table, based on the result of comparing each of corresponding bits of the first code and the second code.

16. The non-transitory computer-readable storage medium as claimed in claim 14, wherein the semiconductor device designing process further includes:
storing a revision code based on a modification log of the semiconductor device, and wherein
the layer information is related to a layer of a mask that is revised based on a modification of a circuit included in the semiconductor device.

17. The non-transitory computer-readable storage medium as claimed in claim 13, wherein
the register is formed on a substrate of the semiconductor device,
and
stores information based on one of mutually different first and second voltages supplied according to a connection of the third wiring.

18. The non-transitory computer-readable storage medium as claimed in claim 17, wherein
the third wiring forms a first power line supplied with the first voltage, and
the fourth wiring forms a second power line supplied with the second voltage.

* * * * *